United States Patent
Lin

(10) Patent No.: US 11,854,650 B2
(45) Date of Patent: *Dec. 26, 2023

(54) MEMORY DEVICE, SENSE AMPLIFIER AND METHOD FOR MISMATCH COMPENSATION

(71) Applicant: Taiwan Semiconductor Manufacturing Company, Ltd., Hsinchu (TW)

(72) Inventor: Ku-Feng Lin, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/084,570

(22) Filed: Dec. 20, 2022

(65) Prior Publication Data

US 2023/0123830 A1 Apr. 20, 2023

Related U.S. Application Data

(63) Continuation of application No. 17/035,609, filed on Sep. 28, 2020, now Pat. No. 11,574,657.

(51) Int. Cl.
G11C 7/06 (2006.01)

(52) U.S. Cl.
CPC .................................. *G11C 7/06* (2013.01)

(58) Field of Classification Search
CPC .. G11C 7/06; G11C 7/065; G11C 7/08; G11C 29/028; G11C 29/026; G11C 7/062; G11C 7/067; G11C 11/4091
See application file for complete search history.

(56) References Cited

U.S. PATENT DOCUMENTS 11,574,657 B2 * 2/2023 Lin ........................ G11C 7/065

* cited by examiner

*Primary Examiner* — Jay W. Radke
(74) *Attorney, Agent, or Firm* — JCIPRNET

(57) ABSTRACT

A memory device that includes a first memory cell, a second memory cell and a sense amplifier. The sense amplifier includes a first branch and a second branch and are configured to output a first voltage and a second voltage to the first memory and the second memory, respectively in a trimming operation. A first clamp device of the sense amplifier includes a first clamp transistor and a plurality of first trimming transistors that are coupled to the first clamp transistor in parallel. The gate terminals of the first clamp transistor and the plurality of first trimming transistors are biased by a fixed clamp voltage. Each of the plurality of first trimming transistors is selectively conducted to compensate a mismatch between the first voltage and the second voltage.

20 Claims, 6 Drawing Sheets

100

MEMORY DEVICE, SENSE AMPLIFIER AND METHOD FOR MISMATCH COMPENSATION

CROSS-REFERENCE TO RELATED APPLICATION

This application is a continuation application of and claims the priority benefit of a prior application Ser. No. 17/035,609 filed on Sep. 28, 2020, now pending. The entirety of the above-mentioned patent application is hereby incorporated by reference herein and made a part of this specification.

BACKGROUND

In a memory device, a sense amplifier is used to amplify a signal difference between signals in a first branch and a second branch of the sense amplifier. Because of unavoidable variations in semiconductor manufacturing processes, a mismatch or offset between the first and second branches of the sense amplifier may exist. As a result of the mismatch existed in the sense amplifier, the performance of the sense amplifier is degraded. Mismatch compensation is necessary to achieve satisfactory performance of the sense amplifier.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
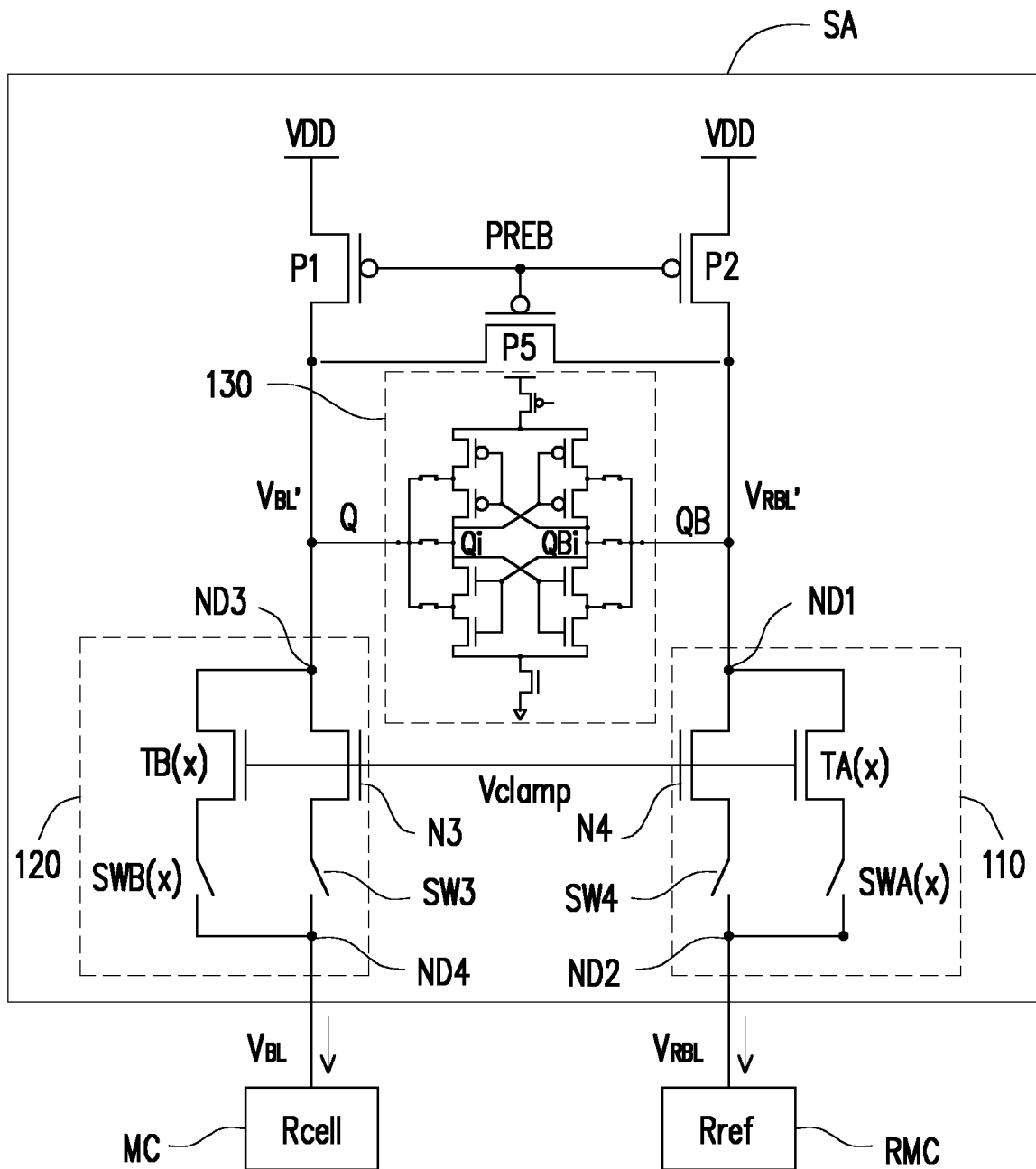
FIG. 1 is a schematic diagram of a memory device that includes a sense amplifier in accordance with some embodiments.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a schematic diagram of a memory device 100 that includes a sense amplifier SA, a memory cell MC and a reference memory cell RMC in accordance with some embodiments. In some embodiments, the sense amplifier SA may include a first branch and a second branch, in which the first branch includes a transistor P2, a node QB and a clamp device 110; and the second branch includes a transistor P1, a node Q and a clamp device 120. The node Q is coupled between the transistor P1 and the clamp device 120; and the node QB is coupled between the transistor P2 and the clamp device 110. The first branch may couple to the reference memory cell RMC through a reference bit line to output a voltage $V_{RBL}$ to the reference memory cell RMC in a trimming operation to the sense amplifier SA; and the second branch may couple to the memory cell MC through a bit line to output a voltage $V_{BL}$ to the memory cell MC in the sense amplifier. In some embodiments, the trimming operation is configured to compensate the mismatch between the voltages $V_{BL}$ and $V_{RBL}$. The mismatch between the voltages $V_{BL}$ and $V_{RBL}$ may exist because of unavoidable variations in semiconductor manufacturing processes. In some embodiments, the memory cell MC and the reference memory cell RMC are located in a memory array (not shown) that is coupled to the sense amplifier SA. In some alternative embodiments, the memory cell MC and the reference memory cell RMC are located in different memory arrays (not shown) that are coupled to the sense amplifier SA. The memory cell MC and the reference memory cell RMC may be memory cells of a resistive random-access memory (RRAM), a phase-change random-access memory (PCRAM), a magnetic random-access memory (MRAM), a static random-access memory (SRAM), a ferroelectric random-access memory (RAM), a flash memory or any other suitable memory types.

In some embodiments, the sense amplifier SA is a current sense amplifier that is configured to sense a current difference between currents flowing through the memory cell MC and the second memory cell RMC in a read operation, thereby determining the logic state of the memory cell MC in the read operation. For example, in the read operation, the sense amplifier SA applies a constant voltage to both the memory cell MC and the reference memory cell RMC. As the application of the constant voltage to the memory cell MC and the reference memory cell RMC, a cell current and a reference current are generated by the memory cell MC and the reference memory cell RMC, respectively. The sense amplifier SA may sense a current difference between the cell current and the reference current. In this way, the sense amplifier SA may determine a logic value that is stored in the memory cell MC.

In some embodiments, the source terminals of the transistors P1 and P2 are coupled to a reference node that receives a power supply voltage VDD. The drain terminals of the transistors P1 and P2 are coupled to the nodes Q and QB, respectively. In some embodiments, the sense amplifier SA further includes a transistor P5 that has a drain terminal and a source terminal being coupled to the drain terminals of the transistor P1 and P2, respectively. The gate terminals of the transistors P1, P2 and P5 are coupled to each other. The transistors P1, P2 and P5 may form a pre-charge circuit that is configured to pre-charge and equalize the nodes Q and QB of the sense amplifier SA to a predetermined voltage level in a pre-charging period. In some embodiments, the transistors P1, P2 and P5 are p-type metal-oxide semiconductor (PMOS) transistors, but the disclosure is not limited thereto. In some alternative embodiments, the transistors P1, P2 and P5 are NMOS transistors.

In some embodiments, the sense amplifier SA is configured to determine a logic state of the memory cell MC in a normal operation (e.g., a read operation). The read operation of the sense amplifier SA may include a plurality of phases. In a pre-charge phase, the sense amplifier SA is configured to charge a selected bit line (e.g., BL) and a reference bit line (e.g., RBL) to a target constant voltage level (e.g., the VBL should be same as voltage VRBL), and a current difference between the cell current from the memory cell MC and the reference current are sensed by the sense amplifier SA. For example, the target constant voltage level is a half of a voltage level of the power supply voltage VDD or any other voltage level that are derived from the power supply voltage VDD. In an evaluation phase, the current difference is converted to a voltage difference which is then amplified by the sense amplifier SA to generate an amplified voltage difference. The logic state of the memory cell MC is determined based on the value of the amplified voltage difference.

The voltage $V_{BL}$ should be the same as the reference voltage $V_{RBL}$ due to symmetric structures of the first and second branches of the sense amplifier SA. In other words, no mismatch or offset should be existed in the first and second branches of an ideal sense amplifier. However, because of unavoidable variations in the manufacturing processes, a mismatch may exist in the first and second branches of the sense amplifier SA, causing a voltage difference between the voltage $V_{BL}$ and the reference voltage $V_{RBL}$. For example, a threshold voltage of the transistor N3 in the first branch is same as the threshold voltage of the transistor N4 in the second branch of the ideal sense amplifier. However, the non-ideal sense amplifier may exist mismatch of threshold voltages of the transistors N3 and N4, causing the mismatch of the voltages $V_{BL}$ and $V_{RBL}$ in the first and second branches of the non-ideal sense amplifier. The mismatch of the transistors P1, P2 or other symmetric components in the first and second branches of the sense amplifier may also cause the mismatch of the voltages $V_{BL}$ and $V_{RBL}$ in the first and second branches of the non-ideal sense amplifier.

The mismatch between the voltages $V_{BL}$ and $V_{RBL}$ may cause a read error in a read operation in a memory device, thus reducing performance and reliability of the memory device. For example, in the read operation, the constant voltage is applied to the memory cell and the reference memory cell through the bit line and the reference bit lines. Upon the application of the constant voltage, a cell current and a reference cell current is generated in the memory cell and the reference memory cell according to resistance values of the memory cell and the reference memory cell. A current difference between the cell current and the reference cell current is sensed to determine the logic state of the memory cell. A mismatch of clamp transistors will make an offset voltage difference or mismatch between the voltage $V_{BL}$ and reference voltage $V_{RBL}$ between the bit line and the reference bit line which will degrade the current difference. When the current difference of the sense amplifier is degraded, the read error may occur. In some embodiments, the clamp devices 110 and 120 are configured to compensate the mismatch of the sense amplifier SA.

In some embodiments, the clamp device 110 includes a main branch and at least one trimming branch that is coupled to the main branch in parallel through common nodes ND1 and ND2. The main branch of the clamp device 110 may include a main transistor N4 and a main switch SW4 that is coupled to the main transistor N4 in series. The at least one trimming branch of the clamp device 110 may include a trimming branch that is formed by a trimming transistor TA(x) and a trimming switch SWA(x), in which the trimming switch SWA(x) is coupled to the trimming transistor TA(x) in series. As the trimming branch is coupled to the main branch of the clamp device 110 in parallel, the trimming branch does not add a small current to a current flowing through the main branch of the clamp device 110. In other words, the current flowing through the main branch of the clamp device 110 is not degraded, and the sensing margin of the sense amplifier SA is improved.

In some embodiments, the trimming operation is performed in a wafer test flow during a manufacturing process before shipping wafer or die to compensate the mismatch between voltages $V_{BL}$ and $V_{RBL}$ in the first and second branches of the sense amplifier SA. The wafer test flow is a testing methodology that includes at least one test to determine whether circuits in the wafer are defective. The wafer test flow records trimming results and stores the trimming results in a non-volatile memory. As such, it is not necessary to perform the trimming during the normal operations of the sense amplifier. The wafer test flow may scan all trimming options to find the best trimming option with minimum fail bit counts or best yield. The trimming results corresponding to the best trimming option is stored in the non-volatile memory.

In some embodiments, the clamp device 120 includes a main branch and at least one trimming branch that is coupled to the main branch in parallel through common nodes ND3 and ND4. The main branch of the clamp device 120 may include a main transistor N3 and a main switch SW3 that is coupled to the main transistor N3 in series. The at least one trimming branch may include a trimming branch that is formed by a trimming transistor TB(x) and a trimming switch SWB(x) coupled to the trimming transistor TB(x) in series. As the trimming branch is coupled to the main branch of the clamp device 120 in parallel, the trimming branch does not add a small current to a current flowing through the main branch of the clamp device 120. In other words, the current flowing through the main branch of the clamp device 120 is not degraded, and the sensing margin of the sense amplifier SA is improved.

Figure 2:
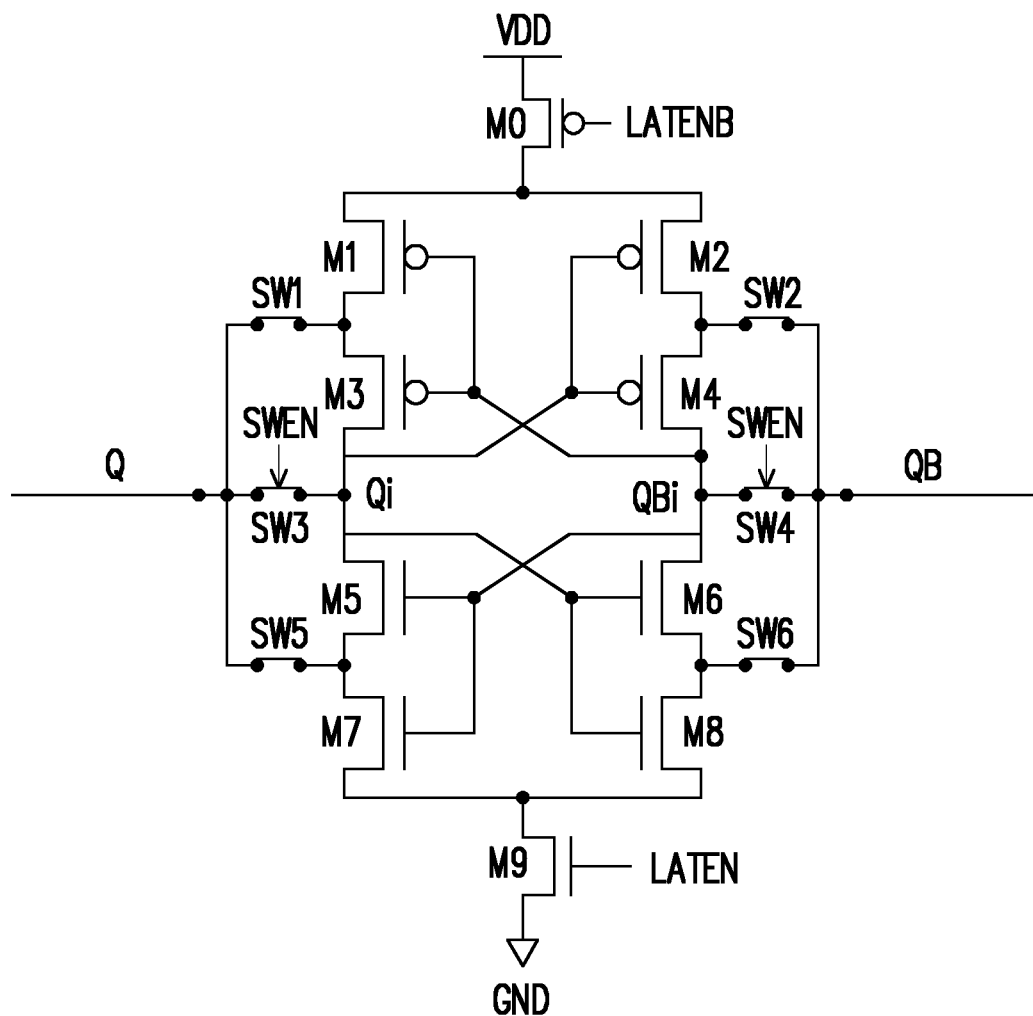
FIG. 2 is a schematic diagram of a voltage comparator circuit of the sense amplifier in FIG. 1 in accordance with some embodiments.

In some embodiments, the sense amplifier SA further includes a voltage comparator 130 that is coupled between the nodes Q and QB. The voltage comparator 130 is configured to determine a voltage difference between the voltages $V_{BL}'$ and $V_{RBL}'$ at the nodes Q and QB of the sense amplifier 100. Referring to FIG. 1 and FIG. 2, the voltage comparator 130 may include a plurality of transistors M0 through M9, a plurality of switches SW1 through SW6 and nodes Qi and QBi. The transistors M0 and M9 are configured to enable or disable the voltage comparator 130 according to enable signals LATENB and LATEN, respectively. The transistors M1 and M3 are cross-coupled to the transistors M2 and M4; and the transistors M5 and M7 are cross-coupled to the transistors M6 and M8. More particularly, the gate terminals of transistors M1, M3, M5 and M7 are coupled to the node QBi, and the gate terminals of the transistors M2, M4, M6 and M8 are coupled to the node Qi. The node Qi and QBi are coupled to the nodes Q and QB through the switches SW3 and SW4, respectively. A connection node between the transistor M1 and M3 and a connection node between the transistor M2 and M4 are coupled to the nodes Q and QB through the switches SW1 and SW2, respectively. A connection node between the transistor M5 and M7 and a connection node between the transistors M6 and M8 are coupled to the nodes Q and QB through the switches SW5 and SW6, respectively.

The nodes Q and QB may act as both input and output of the voltage comparator 130. In some embodiments, the switches SW3 and SW4 may be turned on based on a control signal SWEN to pre-charge the nodes Qi and QBi to a predetermined voltage level. Referring to FIG. 1 and FIG. 2, during a pre-charge period, the signal PREB may switch on the transistors P1, P2 and P5 to pre-charge the nodes Q and QB to the predetermined voltage level. When the nodes Qi and QBi are coupled to the nodes Q and QB, the nodes Qi and QBi are pre-charged to the predetermined voltage level. The switches SW1, SW2, SW5 and SW6 may be turned on to supply the voltages $V_{BL}'$ and $V_{RBL}'$ from the nodes Q and QB to the comparators 130. The comparator 130 may perform a comparison operation based on the voltages inputted from the nodes Q and QB. When the comparison operation is completed, the switches SW3 and SW4 may be turned on to output the comparison result from the nodes Qi and QBi to the nodes Q and QB of the sense amplifier SA.

Figure 3A:
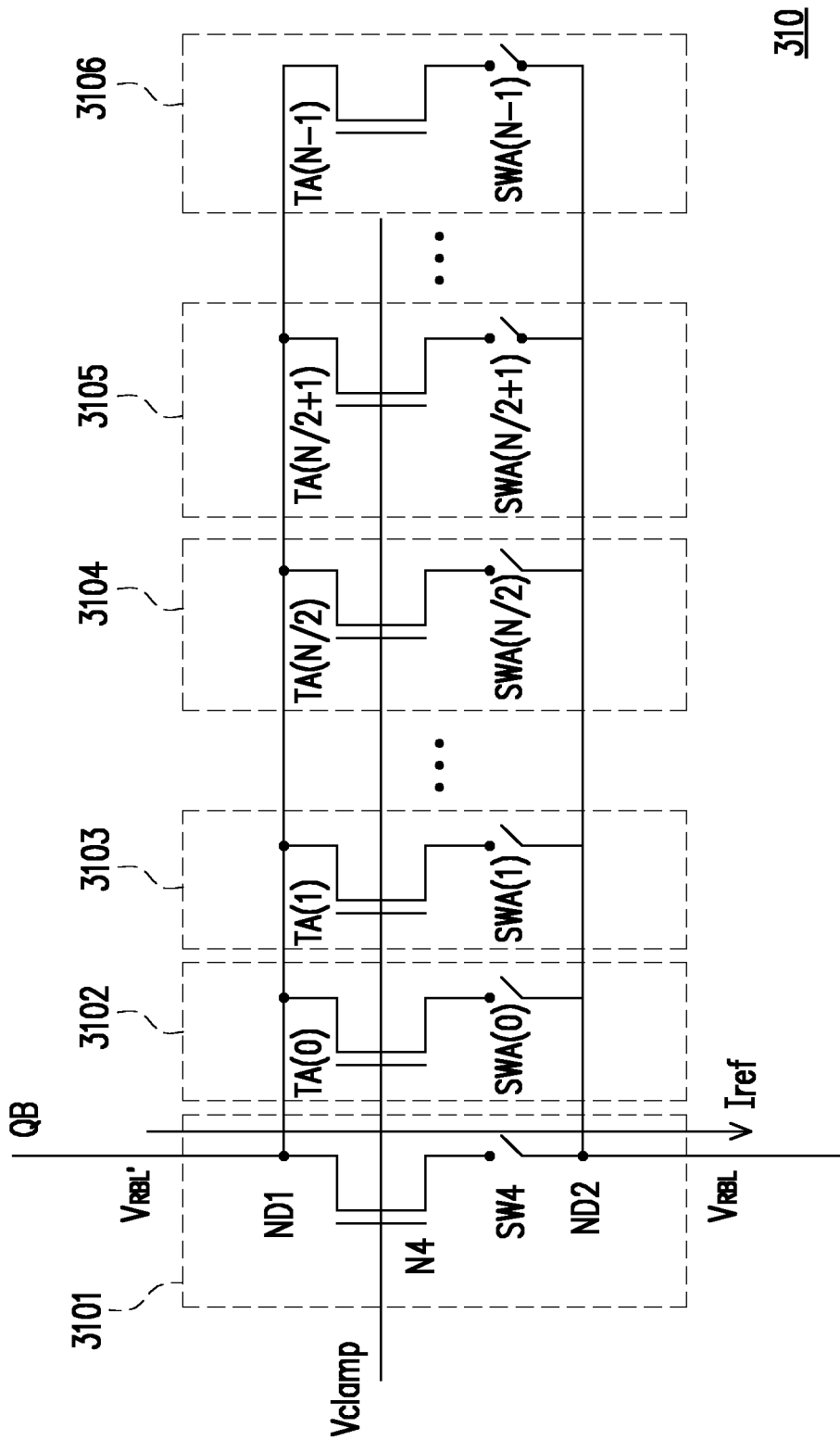
FIG. 3A is a schematic diagram of a clamp device in a first branch of a sense amplifier in accordance with some embodiments.

FIG. 3A illustrates a schematic diagram of a clamp device 310 in accordance with some embodiments. The clamp device 310 illustrated in FIG. 3A shows more details of trimming branches than the clamp device 110 illustrated in FIG. 1. Same components of the clamp device 310 shown in FIG. 3A and the clamp device 110 shown in FIG. 1 are indicated by same reference numbers. The clamp device 310 may include a main branch 3101 and a plurality of trimming branches 3102 through 3106. The main branch 3101 may include the main transistor N4 and the main switch SW4 that is coupled to the main transistor N4 in series. The trimming branches 3102 through 3106 include trimming transistors TA(0) through TA(N-1) and respective trimming switches SWA(0) through SWA(N-1), where N is a positive integer. Each of the trimming transistors TA(0) through TA(N-1) of the trimming branches 3102 through 3106 is coupled to a respective trimming switch among the trimming switches SWA(0) through SWA(N-1) in series.

Referring to FIG. 1 and FIG. 3A, the trimming transistor TA(x) of the clamp device 110 in FIG. 1 may be any one of the trimming transistors TA(0) through TA(N-1) of the clamp device 310 in FIG. 3A. The trimming switch SWA(x) of the clamp device 110 in FIG. 1 may be any one of the trimming switches SWA(0) through SWA(N-1) of the clamp device 310 in FIG. 3A. In some embodiments, the main branch 3101 and the trimming branches 3102 through 3106 are coupled to each other in parallel through the common nodes ND1 and ND2. More particularly, the drain terminals of the main transistor N4 and the trimming transistors TA(0) through TA(N-1) are coupled to each other via the common node ND1. The source terminals of the main transistor N4 and the trimming transistors TA(0) through TA(N-1) are coupled to the common node ND2 via the switches SW4 and SWA(0) through SWA(N-1). In the embodiment shown in FIG. 3A, the switches SW4 and SWA(0) through SWA(N-1) are coupled between the common node ND2 and the transistors N4 and TA(0) through TA(N-1). In some alternative embodiments, the switches SW4 and SWA(0) through SWA (N-1) are coupled between the common node ND1 and the transistors N4 and TA(0) through TA(N-1). As the trimming transistors, when being conducted, are coupled to the main transistor N4 in the main branch 3101 in parallel through the nodes ND1 and ND2, a current Iref flowing through the main branch 3101 is not degraded because of small currents from the trimming branches 3102 through 3106. Accordingly, the sensing margin of the sense amplifier (e.g., sense amplifier SA in FIG. 1) is improved.

In some embodiments, each of the branches 3101 through 3106 of the clamp device 310 is selectively turned on or off to adjust the voltage level of the voltage $V_{RBL}$. In other words, the main switch SW4 and the trimming transistors TA(0) through TA(N-1) are selectively conducted based on the switching operations of the switches SW4 and SWA(0) through SWA(N-1) to adjust the voltage level of the voltage $V_{RBL}$. In some embodiments, the voltage $V_{RBL}$ increases as the number of the turned-on trimming branches in the clamp device 310 increases; and the voltage VRBL decreases as the number of the turned-on trimming branches in the clamp device 310 decreases. In some embodiments, the voltage VRBL may be adjusted step-by-step (e.g., trimming step), in which one trimming branch of the clamp device 310 is turned on or off to adjust the voltage $V_{RBL}$ by a predetermined percentage (e.g., y %, where y is a positive number) of the voltage $V_{RBL}$ in each trimming step. In some embodiments, the clamp device 310 includes a main branch and trimming branches which follow the formula of saturation current of transistors N4 and TA(0) through TA(N-1), in which the current flowing through one of the transistors N4 and TA(0) through TA(N-1) is proportional to a width of the one of the transistors N4 and TA(0) through TA(N-1). If turning on more trimming branches, the total transistor size of conducted transistors in clamp device 310 is larger which can supply larger current to the reference bit line and increase the reference bit line voltage ($V_{RBL}$).

In some embodiments, a transistor size of the main transistor N4 is different from transistor sizes of the trimming transistors TA(0) through TA(N-1), in which a transistor size of a specific transistor may be determined based on a width of the specific transistor or a length of the specific transistor. In some embodiments, the transistor size of the specific transistor is determined according to a ratio of the width and length of the specific transistor. The transistor size of each of the trimming transistors TA(0) through TA(N-1) in the trimming branches 3102 through 3106 may be different from each other.

In some embodiments, a total transistor size of the conducted transistors in the clamp device 310 is calculated according to the transistor sizes of the conducted transistors in the turned-on trimming branches of the clamp device 310. In an embodiment, the total transistor size of the conducted transistors in the clamp device 310 may be the sum of the transistor sizes of the conducted transistors in the clamp device 310. In some embodiments, the transistor sizes of the trimming transistors TA(0) through TA(N-1) in the trimming branches 3102 through 3106 are determined according to the amount of voltage change (e.g., y % of the voltage $V_{RBL}$) in one trimming step. The total transistor size of the conducted transistors in the clamp device 310 may be referred to as an effective width of the clamp device 310.

In some embodiments, the voltage level of the voltage $V_{RBL}$ may be adjusted by adjusting the total transistor size of the conducted transistors in the clamp device 310. The total transistor size of the conducted transistors in the clamp device 310 may be adjusted by turning on or off the trimming branches 3102 through 3106. In other words, the total transistor size of the conducted transistors in the clamp device 310 may be adjusted by controlling the conduction of each of the trimming transistors TA(0) through TA(N−1) using the trimming switches SWA(0) through SWA(N−1). In some embodiments, each of the trimming transistors TA(0) through TA(N−1), when individually conducted, may adjust total transistor size of the conducted transistors in the clamp device 310 by a predetermined size percentage (e.g., x %, where x is a positive number) of the total transistor size of the conducted transistors. For example, to increase the total transistor size of the conducted transistors in the clamp device by x %, one more trimming branch is turned on (e.g., the trimming transistor in one trimming branch is changed from non-conducting state to the conducting state). To decrease the total transistor size of the conducted transistors in the clamp device 310 by x %, one turned-on trimming branch is turned off (e.g., the trimming transistor in the turned-on trimming branch is changed from conducting state to the non-conducting state).

Figure 4:
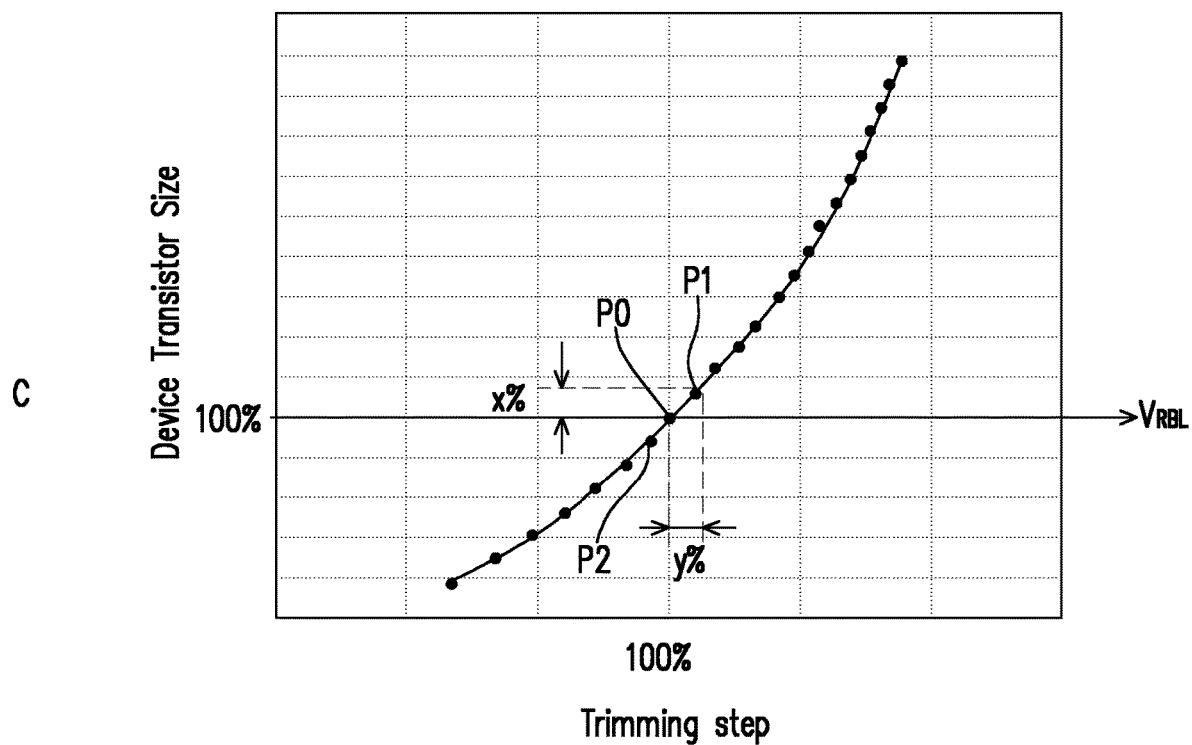
FIG. 4 is a diagram illustrating a relationship between a total transistor size of conducted transistors in a clamp device (or a device transistor size) and a voltage in each trimming step in accordance with some embodiments.

In some embodiments, when the total transistor size of the conducted transistors in the clamp device 110 changes by x %, the voltage level of the voltage $V_{RBL}$ changes by a predetermined percentage (e.g., y %). In other words, each of the trimming transistors TA(0) through TA(N−1), when individually conducted, may adjust the total transistor size of the conducted transistors by x % and may adjust the voltage level of the voltage VRBL by y %. Referring to FIG. 4, a diagram illustrating a relation between the total transistor size of the conducted transistors in the clamp device (e.g., clamp device 310 in FIG. 2) and a voltage $V_{RBL}$ in each trimming step is shown in accordance with some embodiments. The vertical axis of the diagram in FIG. 4 illustrates the total transistor size of the conducted transistors in the clamp device (e.g., clamp device 310 in FIG. 2); and the horizontal axis of the diagram in FIG. 4 illustrates the voltage level of the voltage $V_{RBL}$.

The non-linear curve C illustrates the relation between the total transistor size of the conducted transistors in the clamp device and the voltage $V_{RBL}$ in each trimming step. The point P0 in the non-linear curve C illustrates the total transistor size of the conducted transistors and the voltage $V_{RBL}$ at a default scheme, in which the main transistor N4 of the main branch 3101 and the trimming transistor TA(0) through TA(N/2) of the trimming branches 3102 through 3104 of the clamp device 310 are conducted. In some embodiments, in the default scheme, the main branch and a half of trimming branches of the clamp device 310 are turned on. The other half of the trimming branches (e.g., trimming branches 3105 through 3106) are turned off.

When one more trimming branch among the trimming branches 3101 through 3106 of the clamp device 110 is turned on, the total transistor size of the conducted transistors increases by x % and the voltage $V_{RBL}$ increases by y %. The turning on of one more trimming branch is represented as the point P1 in the non-linear curve C. Similarly, when one turned-on trimming branch among the trimming branches 3101 through 3106 of the clamp device 110 is turned off, the total transistor size of the conducted transistors in decrease by x % and the voltage $V_{RBL}$ decreases by y %. The turning off of one trimming branch is represented as the point P2 of the non-linear curve C. In some embodiments, the clamp device 310 may adjust the total transistor size of the conducted transistors in and the voltage $V_{RBL}$ according to the non-linear curve C illustrated in FIG. 4.

In some embodiments, to compensate the mismatch between the voltages $V_{BL}$ and $V_{RBL}$ in the first and second branches of the sense amplifier, the mismatch between the voltages $V_{BL}$ and $V_{RBL}$ is determined. A number of the trimming transistors among the trimming transistors TA(0) through TA(N−1) are selected based on the mismatch. For example, more trimming transistors are selected for the larger mismatch, and less trimming transistors are selected for smaller mismatch. In some embodiments, the number of turning on trimming branches is decided by the trimming results, lower fail bit counts and higher yield can be achieved by matching $V_{BL}$ and $V_{RBL}$, so trimming branches selection is based on trimming methodology as mentioned above. The selected trimming transistors are conducted to adjust the voltage $V_{RBL}$, thereby compensating the mismatch between the first and second branches of the sense amplifier (e.g., sense amplifier SA in FIG. 1). For example, if each trimming step may change the voltage $V_{RBL}$ by 1% (e.g., y is equal to 1) and the mismatch between the voltages $V_{BL}$ and $V_{RBL}$ is 4%, four more trimming transistors in trimming branches are conducted to compensate the mismatch.

In some embodiments, when the mismatch between the voltages $V_{BL}$ and $V_{RBL}$ is determined, the change of the total transistor size of the conducted transistors in the clamp device (e.g., clamp device 110 in FIG. 1 or clamp device 310 in FIG. 3A) for compensating the mismatch is determined. The change of the total transistor size of the conducted transistors in the clamp device may be determined based on the mismatch using the non-linear curve C shown in FIG. 4. A number of the trimming transistors among the trimming transistors TA(0) through TA(N−1) are selected for conduction based on the change of total transistor size of the conducted transistors in the clamp device. The selected trimming transistors are conducted to adjust the total transistor size of the conducted transistors in the clamp device, thereby compensating the mismatch between the first and second branches of the sense amplifier (e.g., sense amplifier SA in FIG. 1). For example, if the trimming may change the total transistor size of the conducted transistors in the clamp device by 1% (e.g., y is equal to 1) and the mismatch indicates that the total transistor size of the conducted transistors in the clamp device must increase by 4%, four more trimming transistors in trimming branches are conducted to compensate the sense amplifier.

Figure 3B:
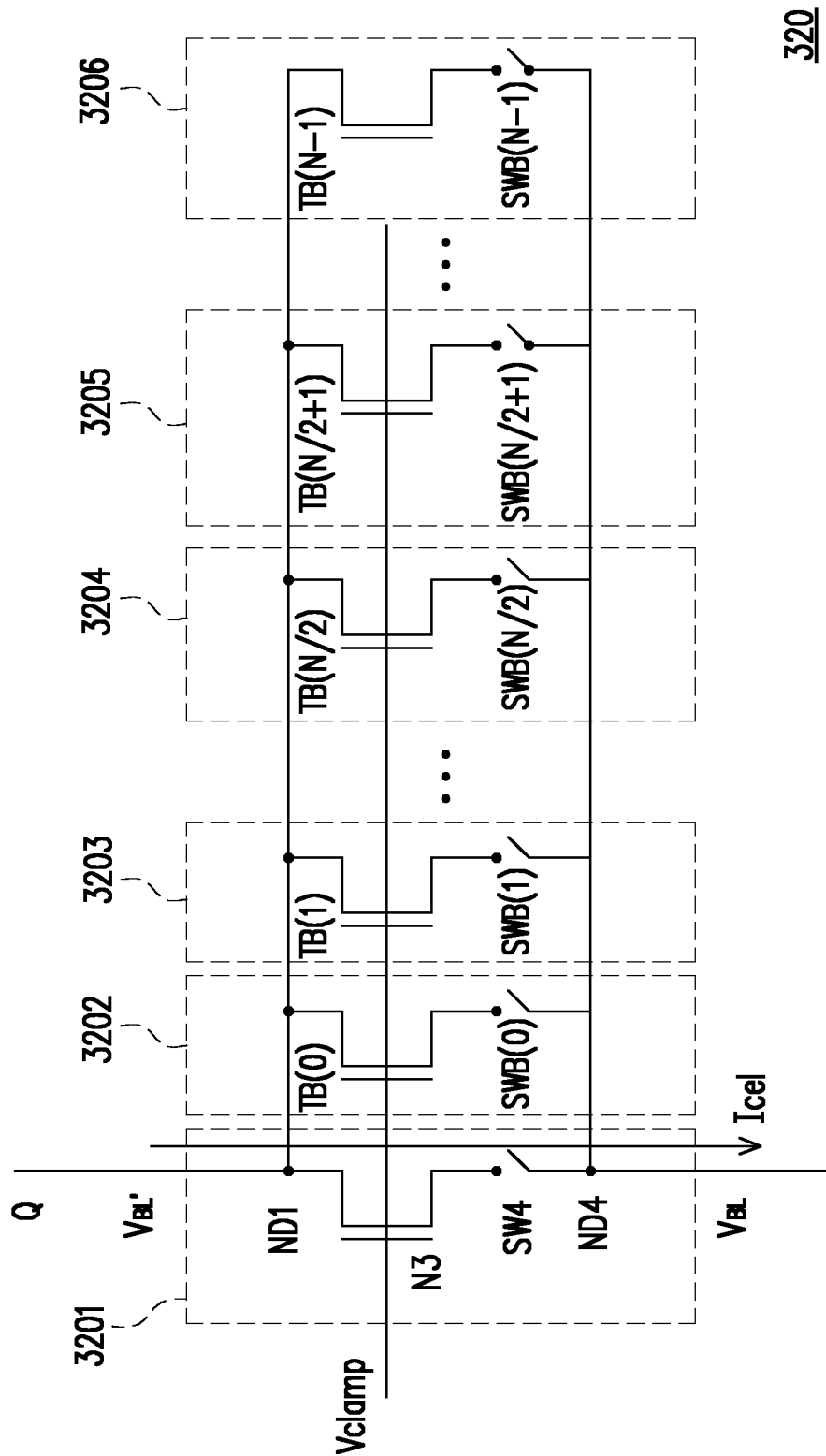
FIG. 3B is a schematic diagram of a clamp device in a second branch of a sense amplifier in accordance with some embodiments.

FIG. 3B illustrates a schematic diagram of a clamp device 320 in accordance with some embodiments. Same components of the clamp device 320 shown in FIG. 3B and the clamp device 120 shown in FIG. 1 are indicated by same reference numbers. The clamp device 320 may include a main branch 3201 and a plurality of trimming branches 3202 through 3206. The main branch 3201 may include the main transistor N3 and the main switch SW3 that is coupled to the main transistor N3 in series. The trimming branches 3202 through 3206 may include trimming transistors TA(0) through TA(N−1) and respective trimming switches SWA(0) through SWA(N−1), where N is a positive integer. Each of the trimming transistors TA(0) through TA(N−1) in the trimming branches 3202 through 3206 is coupled to a respective trimming switch in series.

Referring to FIG. 1 and FIG. 3B, the trimming transistor TB(x) of the clamp device 120 in FIG. 1 may be any one of the trimming transistors TB(0) through TB(N−1) of the clamp device 320 in FIG. 3B. The trimming switch SWB(x) of the clamp device 120 in FIG. 1 may be any one of the trimming switches SWB(0) through SWB (N−1) of the clamp device 320 in FIG. 3B. In some embodiments, the main branch 3201 and the trimming branches 3202 through 3206 are coupled to each other in parallel through the common nodes ND3 and ND4. More particularly, the drain terminals of the main transistor N3 and the trimming transistors TB(0) through TB(N−1) may be coupled to each other via the common node ND3. The source terminals of the main transistor N3 the trimming transistors TB(0) through TB(N−1) are coupled to the common node ND4 via the switches SW3 and SWB(0) through SWB(N−1). In the embodiment shown in FIG. 3B, the switches SW3 and SWB(0) through SWB(N−1) are coupled between the common node ND4 and the transistor N3 and TB(0) through TB(N−1). In some alternative embodiments, the switches SW3 and SWB(0) through SWB(N−1) are coupled between the common node ND3 and the transistors N3 and TB(0) through TB(N−1). As the trimming transistors, when being conducted, are coupled to the main transistor N3 in the main branch 3201 in parallel through the nodes ND3 and ND4, a current Icell flowing through the main branch 3201 is not degraded because of small currents from the trimming branches 3202 through 3206. Accordingly, the sensing margin of the sense amplifier (e.g., sense amplifier SA in FIG. 1) is improved.

In some embodiments, each of the branches 3201 through 3206 of the clamp device 320 is selectively turned on or off to adjust the voltage level of the voltage $V_{BL}$. In other words, the main switch SW3 and the trimming transistors TB(0) through TB(N−1) are selectively conducted based on the switching operations of the switches SW3 and SWB(0) through SWB(N−1) to adjust the voltage level of the voltage $V_{BL}$. In some embodiments, the voltage $V_{BL}$ increases as the number of the turned-on trimming branches in the clamp device 320 increases; and the voltage $V_{BL}$ decreases as the number of the turned-on trimming branches in the clamp device 320 decreases. In some embodiments, the voltage VBL may be adjusted step-by-step (e.g., trimming step), in which one trimming branch of the clamp device 320 is turned on or off to adjust the voltage $V_{BL}$ by a predetermined percentage (e.g., y %, where y is a positive number) in each trimming step.

In some embodiments, a transistor size of the main transistor N3 is different from transistor sizes of the trimming transistors TB(0) through TB(N−1). The transistor size of each of the trimming transistors TB(0) through TB(N−1) in the trimming branches 3202 through 3206 may be different from each other. In some embodiments, the clamp device 320 includes 16 trimming transistors (N=16) and a ratio of the transistor sizes of the trimming transistors and the transistor size of the main transistor is in a range from 0.045 to 0.114. In some embodiments, the total transistor size of the conducted transistors in the clamp device 320 is the sum of the transistor sizes of the conducted transistors in the turned-on branches of the clamp device 320.

In some embodiments, the voltage level of the voltage $V_{BL}$ may be adjusted by adjusting the total transistor size of the conducted transistors in the clamp device 320. The total transistor size of the conducted transistors in the clamp device 320 may be adjusted by turning on or off the trimming branches 3202 through 3206. In other words, the total transistor size of the conducted transistors in the clamp device 320 may be adjusted by controlling the conduction of each of the trimming transistors TB(0) through TB(N−1) using the trimming switches SWB(0) through SWB(N−1). In some embodiments, each of the trimming transistors TB(0) through TB(N−1), when individually conducted, may adjust the total transistor size of the conducted transistors in the clamp device by a predetermined size percentage (e.g., x %, where x is a positive number). For example, to increase the total transistor size of the conducted transistors in the clamp device by x %, one more trimming branch is turned on (e.g., the trimming transistor in one trimming branch is changed from non-conducting state to the conducting state). To decrease the total transistor size of the conducted transistors in the clamp device 320 by x %, one turned-on trimming branch is turned off (e.g., the trimming transistor in the turned-on trimming branch is changed from conducting state to the non-conducting state). In some embodiments, when the total transistor size of the conducted transistors in the clamp device 320 changes by x %, the voltage level of the voltage VBL changes by a predetermined percentage (e.g., y %).

Referring to FIG. 1 and FIG. 3B, in some embodiments, to compensate the mismatch between the voltages $V_{BL}$ and $V_{RBL}$ in the first and second branches of the sense amplifier, the mismatch between the voltages $V_{BL}$ and $V_{RBL}$ is determined. A number of the trimming transistors among the trimming transistors TB(0) through TB(N−1) are selected for conduction based on the mismatch. The selected trimming transistors are conducted to adjust the voltage $V_{BL}$, thereby compensating the mismatch between the first and second branches of the sense amplifier (e.g., sense amplifier SA in FIG. 1). For example, if each trimming step may change the voltage $V_{BL}$ by 1% (e.g., x is equal to 1) and the mismatch between the voltages $V_{BL}$ and VRBL is 4%, four more trimming transistors in trimming branches of the clamp device 320 are conducted to compensate the mismatch.

In some embodiments, when the mismatch between the voltages $V_{BL}$ and $V_{RBL}$ is determined, the change of the total transistor size of the conducted transistors in the clamp device (e.g., clamp device 120 in FIG. 1 or clamp device 320 in FIG. 3B) for compensating the mismatch is determined. A number of the trimming transistors among the trimming transistors TB(0) through TB(N−1) are selected for conduction based on the change of total transistor size of the conducted transistors in the clamp device. The selected trimming transistors are conducted to adjust the total transistor size of the conducted transistors in the clamp device, thereby compensating the mismatch between the first and second branches of the sense amplifier (e.g., sense amplifier SA in FIG. 1). For example, if the trimming may change the total transistor size of the conducted transistors in the clamp device by 1% (e.g., y is equal to 1) and the mismatch indicates that the total transistor size of the conducted transistors in the clamp device must increase by 4%, four more trimming transistors in trimming branches of the clamp device (e.g., clamp device 120 in FIG. 1 or clamp device 320 in FIG. 3B) are conducted to compensate the sense amplifier.

Referring to FIG. 1, FIG. 3A and FIG. 3B, in some embodiments, to compensate the mismatch between the voltages $V_{BL}$ and $V_{RBL}$ in the first and second branches of the sense amplifier, the mismatch between the voltages $V_{BL}$ and $V_{RBL}$ is determined. A first number of the trimming transistors of the clamp device 310 and a second number of trimming transistor of the clamp devices 320 are selected based on the mismatch. The selected trimming transistors in the clamp device 310 and the clamp device 320 are conducted to adjust the voltages $V_{BL}$ and $V_{RBL}$ to compensate the mismatch between the first and second branches of the sense amplifier (e.g., sense amplifier SA in FIG. 1). For example, if each trimming step may change the voltages $V_{BL}$ and VRBL by 1% (e.g., x is equal to 1) and the mismatch between the voltages $V_{BL}$ and $V_{RBL}$ is 4%, two trimming transistors of the clamp device 310 may be changed from non-conducting state to the conducting state and two trimming transistor of the clamp device 320 may be changed from the conducting state to the non-conducting state, and vice versa. In this way, the voltage $V_{BL}$ and $V_{RBL}$ may be adjusted simultaneously using the clamp devices 310 and 320 in the first and second branches of the sense amplifier (e.g., sense amplifier SA in FIG. 1). Accordingly, the mismatch compensation may be performed faster.

In some embodiments, the mismatch compensation may be performed once before the usage of the sense amplifier. When the selected trimming transistors that are turned on or off for mismatch compensation, the configuration of selected trimming transistors is recorded and there is no compensation of mismatch each time the sense amplifier operates.

Figure 5:
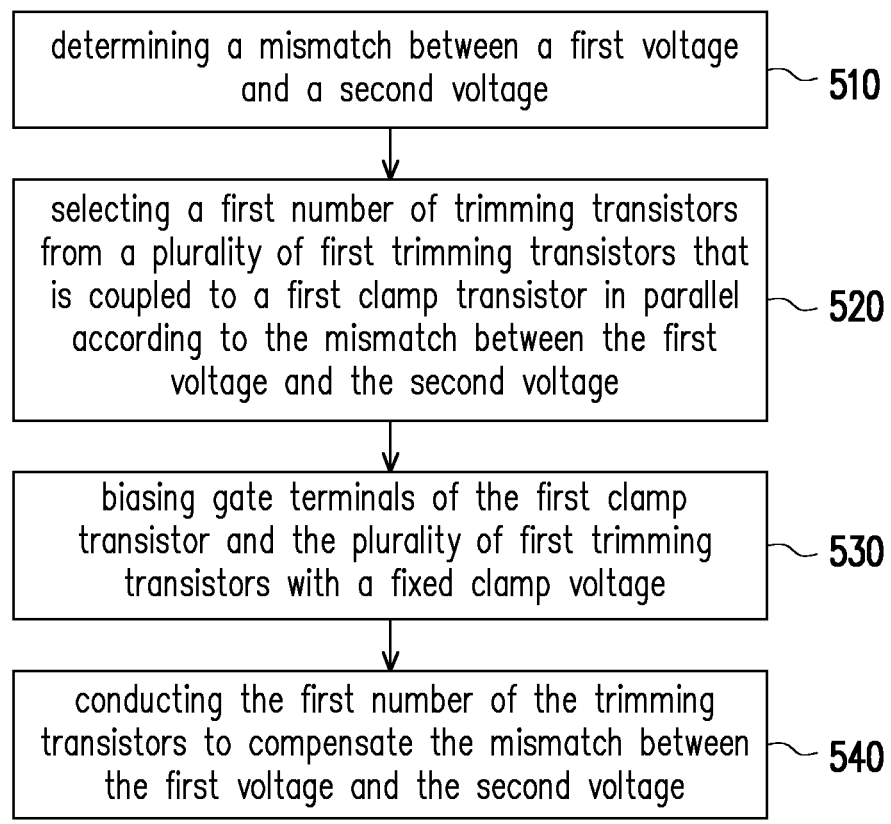
FIG. 5 is a flowchart diagram illustrating a method of compensating a mismatch in a sense amplifier in accordance with some embodiments.

FIG. 5 is a flowchart diagram illustrating a method of compensating a mismatch in a sense amplifier in accordance with some embodiments. In operation S510, a mismatch between a first voltage and a second voltage is determined. In some embodiments, the mismatch between the first voltage and the second voltage is determined in a wafer test flow which is during a manufacturing process. In operation S520, a first number of trimming transistors from a plurality of first trimming transistors are selected according to the mismatch between the first voltage and the second voltage. In some embodiments, the trimming transistors are coupled to a first clamp transistor in parallel. In operation S530, gate terminals of the first clamp transistor and the plurality of first trimming transistors are biased with a fixed clamp voltage. In operation S540, the first number of the trimming transistors are conducted to compensate the mismatch between the first voltage and the second voltage.

In accordance with embodiments of the disclosure, a clamp device of a sense amplifier includes a plurality of trimming branches coupled to a main branch in parallel. The clamp device may adjust a voltage level of a voltage (e.g., reference voltage $V_{RBL}$ or the voltage $V_{BL}$ or both of the reference voltage $V_{RBL}$ and the voltage $V_{BL}$) in a sense amplifier by changing a total transistor size of the conducted transistors in the clamp device, in which the transistors of the main branch and the trimming branches are biased by a fixed clamp voltage. As the voltage level of the voltage in the sense amplifier is adjusted, the mismatch of in first and second branches of the sense amplifier may be compensated without degrading currents flowing through the first and second branches of the sense amplifier. As the currents flowing through the first and second branches of the sense amplifier are not degraded, the sensing margin of the sense amplifier is improved. In addition, the transistor size of the trimming transistors may be appropriately set to reduce the variation of adjusting the voltage in each trimming step. Furthermore, the clamp devices in the first and second branches of the sense amplifier may adjust the voltages in the first and second branches simultaneously to compensate the mismatch between the voltages faster.

In accordance with some embodiments, a memory device that includes a first memory cell, a second memory cell, and a sense amplifier. The sense amplifier includes a first branch and a second branch to output a first voltage and a second voltage to the first memory cell and the second memory cell, respectively in trimming operation. A first clamp device of the sense amplifier a first clamp transistor and a plurality of first trimming transistors that are coupled to the first clamp transistor in parallel. The gate terminals of the first clamp transistor and the plurality of first trimming transistors are biased by a fixed clamp voltage. Each of the plurality of first trimming transistors is selectively conducted to compensate a mismatch between the first voltage and the second voltage.

In accordance with some embodiments, a sense amplifier that includes a first branch that includes a first clamp device and a second clamp branch is introduced. The first branch and the second branch are configured to output a first voltage and a second voltage, respectively. The first clamp device includes a first clamp transistor and a plurality of first trimming transistors that are coupled to the first clamp transistor in parallel. The gate terminals of the first clamp transistor and the plurality of first trimming transistors are biased by a fixed clamp voltage. Each of the plurality of first trimming transistors is selectively conducted to compensate a mismatch between the first voltage and the second voltage.

In accordance with some embodiments, a method of compensating a mismatch in a sense amplifier is introduced. The method includes operations of determining a mismatch between a first voltage and a second voltage; selecting a first number of trimming transistors from a plurality of first trimming transistors that is coupled to a first clamp transistor in parallel according to the mismatch between the first voltage and the second voltage; biasing gate terminals of the first clamp transistor and the plurality of first trimming transistors with a fixed clamp voltage; and conducting the first number of the trimming transistors to compensate the mismatch between the first voltage and the second voltage.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein, Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A memory device, comprising:
a memory array with a first memory cell and a second memory cell; and
a sense amplifier, comprising:
a first branch, comprising a first clamp device, configured to output a first voltage to the first memory cell in a trimming operation;
a second branch, comprising a second clamp device, configured to output a second voltage to the second memory cell in the trimming operation,
wherein the first clamp device comprises a first clamp transistor and a plurality of first trimming transistors coupled to the first clamp transistor in parallel, the first clamp transistor and the plurality of first trimming transistors are biased by a fixed clamp voltage, and each of the plurality of first trimming transistors is selectively conducted to compensate a mismatch between the first voltage and the second voltage,
wherein the second clamp device comprises a second clamp transistor and a plurality of second trimming transistors that are coupled to the second clamp transistor in parallel, wherein the second clamp transistor and the plurality of second trimming transistors are biased by the fixed clamp voltage.

2. The memory device of claim 1, wherein the fixed clamp voltage has a fixed voltage level, a gate terminal of the first clamp transistor and gate terminals of the plurality of first trimming transistors are biased by the fixed clamp voltage, and a gate terminal of the second clamp transistor and gate terminals of the plurality of second trimming transistors are biased by the fixed clamp voltage,
each of the plurality of second trimming transistors is selectively conducted to adjust a voltage level of the second voltage.

3. The memory device of claim 1, wherein
the first clamp transistor has a first drain terminal and a first source terminal,
the plurality of first trimming transistors have a plurality of second drain terminals and a plurality of second source terminals,
the first drain terminal of the first clamp transistor is coupled to the plurality of second drain terminals of the plurality of first trimming transistors through a first common node, and
the first source terminal of the first clamp transistor is coupled to the plurality of second source terminals of the plurality of first trimming transistors through a second common node.

4. The memory device of claim 3, wherein the first clamp device further comprises:
a first switch, coupled between the first source terminal of the first clamp transistor and the second common node, configured to conduct or insulate the first clamp transistor from the second common node; and
a plurality of first trimming switches, coupled between the plurality of source terminals of the plurality of first trimming transistors and the second common node, configured to conduct or insulate the plurality of first trimming transistors from the second source node.

5. The memory device of claim 1, wherein
each of the plurality of first trimming transistors, when individually conducted, is configured to adjust a voltage level of the first voltage by a first percentage of the first voltage;
the plurality of first trimming transistors include a first number of conducted trimming transistors, and
the first number of conducted trimming transistors is determined according to the first percentage of the first voltage and the mismatch between the first voltage and the second voltage.

6. The memory device of claim 1, wherein
a transistor width of the first clamp transistor is greater than a transistor width of each of the plurality of first trimming transistors, and
a transistor width of one of the plurality of first trimming transistors is different from a transistor width of another one of the plurality of first trimming transistors.

7. The memory device of claim 6, wherein each of the plurality of first trimming transistors, when individually conducted, is configured to adjust a total transistor size of conducted transistors in the first clamp device by a second percentage of the total transistor size of the conducted transistors in the first clamp device,
the plurality of first trimming transistors include a first number of conducted trimming transistors, and
the first number of conducted trimming transistors is determined according to the second percentage of the total transistor size of the conducted transistors in the first clamp device and a change of the total transistor size of the conducted transistors in the first clamp device, wherein the change of the total transistor size of the conducted transistors in the first clamp device is determined according to the mismatch between the first voltage and the second voltage.

8. The memory device of claim 1, wherein
each of the plurality of second trimming transistors, when individually conducted, is configured to adjust the voltage level of the second voltage by a third percentage of the second voltage, and
the plurality of second trimming transistors include a second number of conducted trimming transistors, and
the second number of conducted trimming transistors is determined according to the third percentage of the second voltage and the mismatch between the first voltage and the second voltage.

9. The memory device of claim 8, wherein
each of the plurality of second trimming transistors, when individually conducted, is configured to adjust a total transistor size of conducted transistors in the second clamp device by a fourth percentage of the total transistor size of the conducted transistors in the second clamp device,
the plurality of second trimming transistors include a second number of conducted trimming transistors, and
the second number of conducted trimming transistors is determined according to the fourth percentage of the total transistor size of the conducted transistors in the second clamp device and a change of the total transistor size of the conducted transistors in the second clamp device, wherein the change of the total transistor size of the conducted transistors in the second clamp device is determined according to the mismatch between the first voltage and the second voltage.

10. A sense amplifier, comprising:
a first branch, comprising a first clamp device, configured to output a first voltage; and
a second branch, configured to output a second voltage,
wherein the first clamp device comprises a first clamp transistor and a plurality of first trimming transistors coupled to the first clamp transistor in parallel, the first clamp transistor and the plurality of first trimming transistors are biased, and each of the plurality of first trimming transistors is selectively conducted to compensate a mismatch between the first voltage and the second voltage,
wherein the second clamp device comprises a second clamp transistor and a plurality of second trimming transistors that are coupled to the second clamp transistor in parallel, wherein the second clamp transistor and gate terminals of the plurality of second trimming transistors are biased by the fixed clamp voltage.

11. The sense amplifier of claim 10, wherein
the first clamp transistor has a first drain terminal and a first source terminal,
the plurality of first trimming transistors have a plurality of second drain terminals and a plurality of second source terminals,
the first drain terminal of the first clamp transistor is coupled to the plurality of second drain terminals of the plurality of first trimming transistors through a first common node, and
the first source terminal of the first clamp transistor is coupled to the plurality of second source terminals of the plurality of first trimming transistors through a second common node.

12. The sense amplifier of claim 11, further comprising:
a first switch, coupled between the first source terminal of the first clamp transistor and the second common node, configured to conduct or insulate the first clamp transistor from the second common node; and
a plurality of first trimming switches, coupled between the plurality of source terminals of the plurality of first trimming transistors and the second common node, configured to conduct or insulate the plurality of first trimming transistors from the second source node.

13. The sense amplifier of claim 10, wherein
each of the plurality of first trimming transistors, when individually conducted, is configured to adjust a voltage level of the first voltage by a first percentage of the first voltage;
the plurality of first trimming transistors include a first number of conducted trimming transistors, and
the first number of conducted trimming transistors is determined according to the first percentage of the first voltage and the mismatch between the first voltage and the second voltage.

14. The sense amplifier of claim 10, wherein
each of the plurality of first trimming transistors, when individually conducted, is configured to adjust a total transistor size of conducted transistors in the first clamp device by a second percentage of the total transistor size of the conducted transistors in the first clamp device,
the plurality of first trimming transistors include a first number of conducted trimming transistors, and
the first number of conducted trimming transistors is determined according to the second percentage of the total transistor size of the conducted transistors in the first clamp device and a change of the total transistor size of the conducted transistors in the first clamp device, wherein the change of the total transistor size of the conducted transistors in the first clamp device is determined according to the mismatch between the first voltage and the second voltage.

15. The sense amplifier of claim 10, wherein each of the plurality of second trimming transistors is selectively conducted to adjust a voltage level of the second voltage.

16. The sense amplifier of claim 15, wherein
each of the plurality of second trimming transistors, when individually conducted, is configured to adjust the voltage level of the second voltage by a third percentage of the second voltage, and
the plurality of second trimming transistors include a second number of conducted trimming transistors, and
the second number of conducted trimming transistors is determined according to the third percentage of the second voltage and the mismatch between the first voltage and the second voltage.

17. The sense amplifier of claim 15, wherein
each of the plurality of second trimming transistors, when individually conducted, is configured to adjust a total transistor size of conducted transistors in the second clamp device by a fourth percentage of the total transistor size of the conducted transistors in the second clamp device,
the plurality of second trimming transistors include a second number of conducted trimming transistors, and
the second number of conducted trimming transistors is determined according to the fourth percentage of the total transistor size of the conducted transistors in the second clamp device and a change of the of the total transistor size of the conducted transistors in the second clamp device, wherein the change of the of the total transistor size of the conducted transistors in the second clamp device is determined according to the mismatch between the first voltage and the second voltage.

18. A control method for a sense amplifier, wherein the sense amplifier comprises a first clamp device and a second clamp device, the first clamp device comprises a first clamp transistor and a plurality of first trimming transistors, and the second clamp device comprises a second clamp transistor and a plurality of second trimming transistors, the control method comprising:
determining the mismatch between the first voltage and the second voltage in the sense amplifier;
selecting a first number of trimming transistors from the plurality of first trimming transistors that is coupled to the first clamp transistor in parallel according to the mismatch between the first voltage and the second voltage;
biasing the first clamp transistor and the plurality of first trimming transistors with a fixed clamp voltage;
selecting a second number of trimming transistors from the plurality of second trimming transistors that is coupled to the first clamp transistor in parallel according to the mismatch between the first voltage and the second voltage;
biasing the second clamp transistor and the plurality of second trimming transistors with the fixed clamp voltage; and
conducting the first number of the trimming transistors and the second number of trimming transistors to compensate the mismatch between the first voltage and the second voltage.

19. The method of claim 18, wherein
each of the plurality of first trimming transistors, when individually conducted, is configured to adjust a voltage level of the first voltage by a first percentage of the first voltage;
the plurality of first trimming transistors include a first number of conducted trimming transistors, and
the first number of conducted trimming transistors is determined according to the first percentage of the first voltage and the mismatch between the first voltage and the second voltage,
each of the plurality of second trimming transistors, when individually conducted, is configured to adjust the voltage level of the second voltage by a third percentage of the second voltage,
the plurality of second trimming transistors include a second number of conducted trimming transistors, and
the second number of conducted trimming transistors is determined according to the third percentage of the second voltage and the mismatch between the first voltage and the second voltage.

20. The method of claim 18, further comprising:
determining a change of a total transistor size of conducted transistors in a clamp device according to the mismatch between the first voltage and the second voltage, wherein
each of the plurality of first trimming transistors, when individually conducted, is configured to adjust the total transistor size of the conducted transistors in the clamp device by a second percentage of the total transistor size of the conducted transistors in the clamp device, and
the first number of conducted trimming transistors is determined according to the second percentage of the total transistor size of the conducted transistors in the clamp device and the change of the total transistor size of the conducted transistors in the clamp device.

\* \* \* \* \*